(12) United States Patent
Harris et al.

(10) Patent No.: US 11,935,770 B2
(45) Date of Patent: Mar. 19, 2024

(54) MODULAR MAINFRAME LAYOUT FOR SUPPORTING MULTIPLE SEMICONDUCTOR PROCESS MODULES OR CHAMBERS

(71) Applicant: Applied Materials, Inc., Santa Clara, CA (US)

(72) Inventors: Randy A. Harris, Kalispell, MT (US); Coby Scott Grove, Whitefish, MT (US); Paul Zachary Wirth, Kalispell, MT (US); Avinash Shantaram, Whitefish, MT (US); Alpay Yilmaz, San Jose, CA (US); Amir Nissan, Sunnyvale, CA (US); Vincent Dicaprio, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 365 days.

(21) Appl. No.: 17/177,882

(22) Filed: Feb. 17, 2021

(65) Prior Publication Data
US 2022/0262652 A1 Aug. 18, 2022

(51) Int. Cl.
*H01L 21/67* (2006.01)
*H01L 21/677* (2006.01)
*H01L 21/687* (2006.01)

(52) U.S. Cl.
CPC .... *H01L 21/6719* (2013.01); *H01L 21/67173* (2013.01); *H01L 21/67201* (2013.01);
(Continued)

(58) Field of Classification Search
CPC ........... H01L 21/6719; H01L 21/67173; H01L 21/67201; H01L 21/67207;
(Continued)

(56) References Cited

U.S. PATENT DOCUMENTS 9,443,749 B2 9/2016 Wakabayashi et al.
2003/0131458 A1 7/2003 Wang et al.
(Continued)

FOREIGN PATENT DOCUMENTS

KR 10-2008-0072238 A 8/2008
KR 10-1877272 B1 7/2018

OTHER PUBLICATIONS

PCT International Search Report and Written Opinion for PCT/US2022/047702 dated Feb. 27, 2023.
(Continued)

*Primary Examiner* — Glenn F Myers
(74) *Attorney, Agent, or Firm* — MOSER TABOADA (57) ABSTRACT

Methods and apparatus bonding chiplets to substrates are provided herein. In some embodiments, a multi-chamber processing tool for processing a substrate includes: an equipment front end module (EFEM) having one or more loadports for receiving one or more types of substrates; and a plurality of automation modules coupled to each other and having a first automation module coupled to the EFEM, wherein each of the plurality of automation modules include a transfer chamber and one or more process chambers coupled to the transfer chamber, wherein the transfer chamber includes a buffer configured to hold a plurality of the one or more types of substrates, and wherein the transfer chamber includes a transfer robot configured to transfer the one or more types of substrates between the buffer, the one or more process chambers, and a buffer disposed in an adjacent automation module of the plurality of automation modules.

20 Claims, 8 Drawing Sheets

(52) U.S. Cl.
CPC .. *H01L 21/67207* (2013.01); *H01L 21/67766* (2013.01); *H01L 21/68707* (2013.01)

(58) Field of Classification Search
CPC ......... H01L 21/67766; H01L 21/68707; H01L 21/67184; H01L 21/67161; H01L 21/67294; H01L 21/67236
See application file for complete search history.

(56) References Cited

U.S. PATENT DOCUMENTS

| | | | |
|---|---|---|---|
| 2004/0207836 A1* | 10/2004 | Chhibber | G01N 21/8806 356/237.4 |
| 2005/0113976 A1* | 5/2005 | van der Meulen | H01L 21/67742 700/264 |
| 2006/0156979 A1 | 7/2006 | Thakur et al. | |
| 2007/0017445 A1* | 1/2007 | Takehara | C23C 16/54 118/719 |
| 2007/0093071 A1* | 4/2007 | Verhaverbeke | H01L 21/67173 430/269 |
| 2007/0264106 A1* | 11/2007 | van der Meulen | B25J 9/0084 414/217 |
| 2008/0138176 A1* | 6/2008 | Kim | H01L 21/67196 414/217 |
| 2009/0139662 A1 | 6/2009 | Nakamura et al. | |
| 2015/0293363 A1 | 10/2015 | Diehl et al. | |
| 2015/0303094 A1* | 10/2015 | Kim | H01L 21/67161 156/345.32 |
| 2016/0079100 A1* | 3/2016 | Gould | C23C 16/52 156/345.31 |
| 2016/0293459 A1 | 10/2016 | Cha et al. | |
| 2017/0110354 A1* | 4/2017 | Daugherty | H01L 21/67727 |
| 2017/0148651 A1 | 5/2017 | Kao et al. | |
| 2018/0047598 A1 | 2/2018 | Gould et al. | |
| 2019/0279956 A1 | 9/2019 | Iguchi et al. | |
| 2021/0166953 A1* | 6/2021 | Hsiung | H01L 23/367 |
| 2021/0330431 A1 | 10/2021 | Yang et al. | |

OTHER PUBLICATIONS

PCT International Search Report and Written Opinion for PCT/US2022/016732 dated Feb. 17, 2022.

* cited by examiner

MODULAR MAINFRAME LAYOUT FOR SUPPORTING MULTIPLE SEMICONDUCTOR PROCESS MODULES OR CHAMBERS

FIELD

Embodiments of the present disclosure generally relate to substrate processing equipment.

BACKGROUND

Substrates undergo various processes during the fabrication of semiconductor integrated circuit devices. Some of these processes include wafer dicing, in which a processed wafer is placed on a dicing tape and is cut or separated into a plurality of die or chiplets. Once the wafer has been diced, the chiplets typically stay on the dicing tape until they are extracted and bonded to a substrate. Convention processing tools for cleaning, dicing, and bonding chiplets to a substrate generally include multiple tools or a single linear robot housed in a mainframe tool. A number of chambers or process modules may be coupled to the mainframe and generally determine a length of the mainframe and the single linear robot. However, the tool comprising a single linear robot housed in the mainframe provides limited expandability and processing throughput.

Accordingly, the inventors have provided improved multi-chamber processing tools for processing substrates.

SUMMARY

Methods and apparatus for processing substrates herein. In some embodiments, a multi-chamber processing tool for processing substrates includes: an equipment front end module (EFEM) having one or more loadports for receiving one or more types of substrates; and a plurality of automation modules coupled to each other and having a first automation module coupled to the EFEM, wherein each of the plurality of automation modules include a transfer chamber and one or more process chambers coupled to the transfer chamber, wherein the transfer chamber includes a buffer configured to hold a plurality of the one or more types of substrates, and wherein the transfer chamber includes a transfer robot configured to transfer the one or more types of substrates between the buffer, the one or more process chambers, and a buffer disposed in an adjacent automation module of the plurality of automation modules.

In some embodiments, a multi-chamber processing tool for processing a substrate includes: an equipment front end module (EFEM) having one or more first loadports for receiving a first type of substrate, one or more second loadports for receiving a second type of substrate having a plurality of chiplets, and a EFEM robot configured to transfer the first type of substrate and the second type of substrate; and a plurality of automation modules coupled to each other and having a first automation module coupled to the EFEM, wherein each of the plurality of automation modules include a transfer chamber and a one or more process chambers comprising at least one of a wet clean chamber, a plasma chamber, a degas chamber, a radiation chamber, or a bonder chamber, coupled to the transfer chamber, wherein the transfer chamber includes a buffer configured to hold one or more of the first type of substrates and one or more of the second type of substrates, and wherein the transfer chamber includes a transfer robot configured to transfer the first type of substrate and the second type of substrate between the buffer, the one or more process chambers, and a buffer disposed in an adjacent automation module of the plurality of automation modules; and wherein the one or more process chambers of a first automation module of the plurality of automation modules includes at least one of a plasma chamber or a degas chamber and includes a wet clean chamber, a second automation module of the plurality of automation modules coupled to the first automation module includes at least one of a plasma chamber or a degas chamber, and a third automation module of the plurality of automation modules coupled to the second automation module includes one or more bonder chambers configured to remove the plurality of chiplets from the second type of substrate and bond the plurality of chiplets onto the first type of substrate.

In some embodiments, a method of bonding a plurality of chiplets onto a substrate includes: loading a first type substrate onto a first loadport of an equipment front end module (EFEM) of a multi-chamber processing tool having a plurality of automation modules; using an EFEM robot to transfer the first type substrate to a first buffer disposed in a first automation module coupled to the EFEM; serially transferring the first type of substrate from the first buffer to a first wet clean chamber to perform a cleaning process, to a first degas chamber to perform a degas process to dry the first type of substrate, to a first plasma chamber to perform a plasma etch process to remove unwanted material form the first type of substrate, and to a bonder chamber; using the EFEM robot to transfer a second type of substrate, having a plurality of chiplets, to the first buffer; serially transferring the second type of substrate from the first buffer to a second wet clean chamber to perform a cleaning process, to a second degas chamber to perform a degas process to dry the second type of substrate, to a second plasma chamber to perform a plasma etch process to remove unwanted material from the second type of substrate, to a radiation chamber to perform a radiation process to weaken bonds between the plurality of chiplets and second type of substrate, and to the bonder chamber; transferring at least some of the plurality of chiplets from the second type of substrate to the first type of substrate in the bonder chamber; and bonding the at least some of the plurality of chiplets to the first type of substrate in the bonder chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing substrates are provided herein. The apparatus generally comprises a multi-chamber processing tool that is modular and includes one or more equipment front end modules (EFEM) for loading substrates into and out of the multi-chamber processing tool that are coupled to a plurality of automation modules configured to perform one or more processing steps on the substrates. The one or more processing steps may be any suitable step in manufacturing or packaging integrated circuits. For example, the one or more processing steps may be configured to perform one or more of the following: a bonding process to bond a plurality of chiplets onto the substrates, a plasma dicing or singulation process, a substrate cleaning process, a substrate plating or coating process, or the like. The plurality of automation modules generally can interface with the EFEM to hand off substrates to one or more process chambers associated with each of the automation modules.

Each of the plurality of automation modules include a transfer robot, allowing the transfer robots to work in parallel to advantageously increase processing throughput by facilitating processing of multiple substrates at the same time. For the example process of bonding the plurality of chiplets onto the substrates, the multi-chamber processing tool advantageously allows for bonding a plurality of chiplets having different sizes onto the substrates and allows for bonding of the plurality of chiplets in multiple layers on the substrates within the multi-chamber processing tool.

Figure 1:
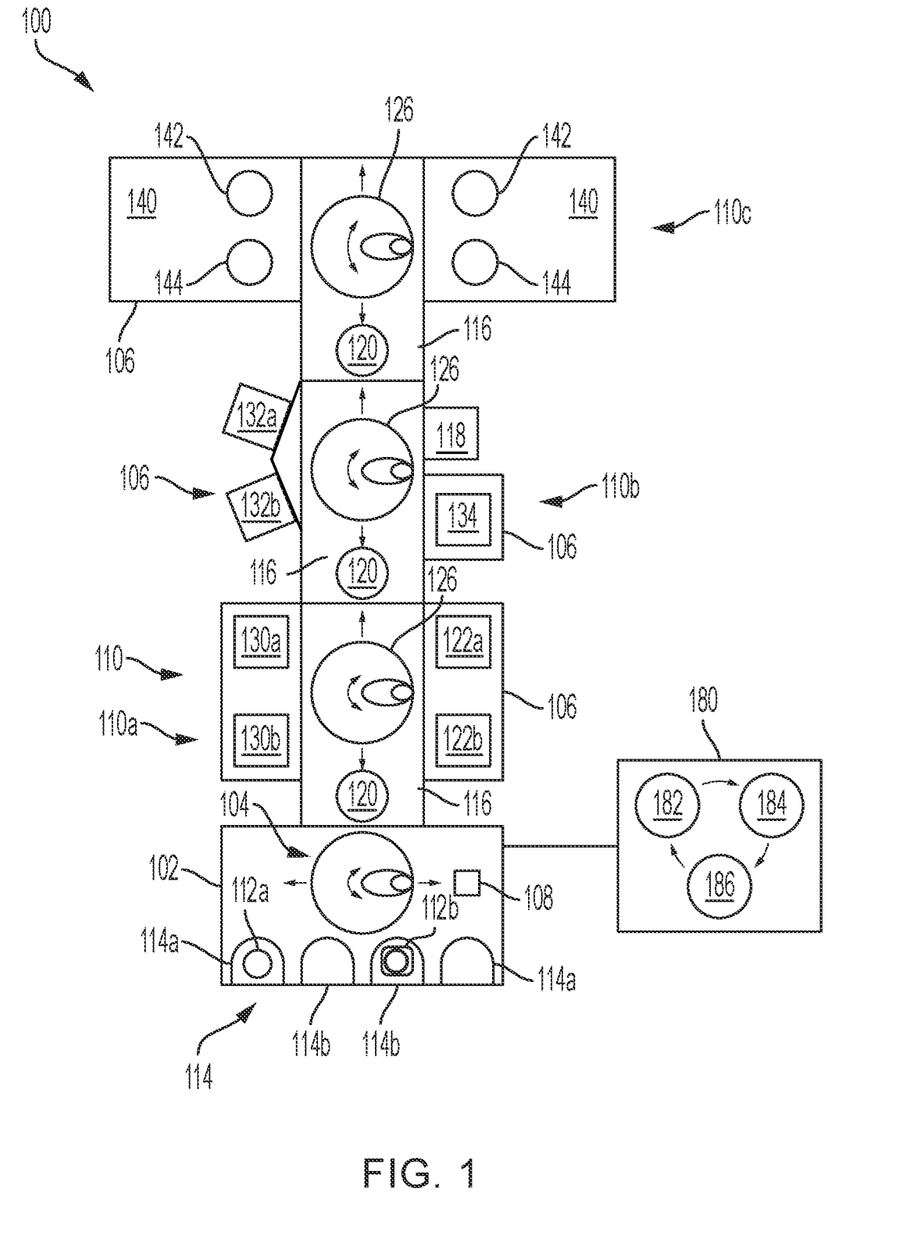
FIG. 1 depicts a schematic top view of a multi-chamber processing tool for bonding chiplets to a substrate in accordance with at least some embodiments of the present disclosure.

FIG. 1 depicts a schematic top view of a multi-chamber processing tool 100 for bonding chiplets to a substrate in accordance with at least some embodiments of the present disclosure. The multi-chamber process tool 100 generally includes an equipment front end module (EFEM) 102 and a plurality of automation modules 110 that are serially coupled to the EFEM 102. The plurality of automation modules 110 are configured to shuttle one or more types of substrates 112 from the EFEM 102 through the multi-chamber process tool 100 and perform one or more processing steps to the one or more types of substrates 112. Each of the plurality of automation modules 110 generally include a transfer chamber 116 and one or more process chambers 106 coupled to the transfer chamber 116 to perform the one or more processing steps. The plurality of automation modules 110 are coupled to each other via their respective transfer chamber 116 to advantageously provide modular expandability and customization of the multi-chamber process tool 100. As depicted in FIG. 1, the plurality of automation modules 110 comprise three automation modules, where a first automation module 110a is coupled to the EFEM 102, a second automation module 110b is coupled to the first automation module 110a, and a third automation module 110c is coupled to the second automation module 110b.

The EFEM 102 includes a plurality of loadports 114 for receiving one or more types of substrates 112. In some embodiments, the one or more types of substrates 112 include 200 mm wafers, 300 mm wafers, 450 mm wafers, tape frame substrates, carrier substrates, silicon substrates, glass substrates, or the like. In some embodiments, the plurality of loadports 114 include at least one of one or more first loadports 114a for receiving a first type of substrate 112a or one or more second loadports 114b for receiving a second type of substrate 112b. In some embodiments, the first type of substrates 112a have a different size than the second type of substrates 112b. In some embodiments, the second type of substrates 112b include tape frame substrates or carrier substrates. In some embodiments, the second type of substrates 112b include a plurality of chiplets disposed on a tape frame or carrier plate. In some embodiments, the second type of substrates 112b may hold different types and sizes of chiplets. As such, the one or more second loadports 114b may have different sizes or receiving surfaces configured to load the second type of substrates 112b having different sizes.

In some embodiments, the plurality of loadports 114 are arranged along a common side of the EFEM 102. Although FIG. 1 depicts a pair of the first loadports 114a and a pair of the second loadports 114b, the EFEM 102 may include other combinations of loadports such as one first loadport 114a and three second loadports 114b.

In some embodiments, the EFEM 102 includes a scanning station 108 having substrate ID readers for scanning the one or more types of substrates 112 for identifying information. In some embodiments, the substrate ID readers include a bar code reader or an optical character recognition (OCR) reader. The multi-chamber processing tool 100 is configured to use any identifying information from the one or more types of substrates 112 that are scanned to determine process steps based on the identifying information, for example, different process steps for the first type of substrates 112a and the second type of substrates 112b. In some embodiments, the scanning station 108 may also be configured for rotational movement to align the first type of substrates 112a or the second type of substrates 112b. In some embodiments, the one or more of the plurality of automation modules 110 include a scanning station 108.

An EFEM robot 104 is disposed in the EFEM 102 and configured to transport the first type of substrates 112a and the second type of substrates 112b between the plurality of loadports 114 to the scanning station 108. The EFEM robot 104 may include substrate end effectors for handling the first type of substrates 112a and second end effectors for handling the second type of substrates 112b. The EFEM robot 104 may rotate or rotate and move linearly.

Figure 6:
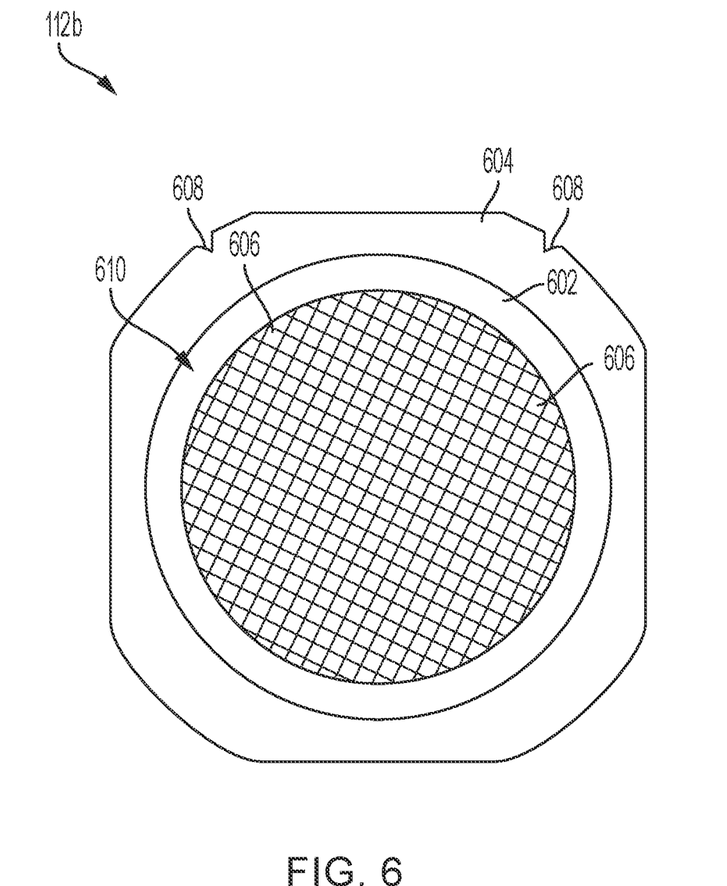
FIG. 6 depicts a second type of substrate in accordance with at least some embodiments of the present disclosure.

FIG. 6 depicts a second type of substrate 112b in accordance with at least some embodiments of the present disclosure. In some embodiments, the second type of substrate 112b is a tape frame substrate that generally comprises a layer of backing tape 602 surrounded by a tape frame 604. In use, a plurality of chiplets 606 can be attached to the backing tape 302. The plurality of chiplets 606 are generally formed via a singulation process that dices a semiconductor wafer 610 into the plurality of chiplets 606 or dies. In some embodiments, the tape frame 604 is made of metal, such as stainless steel. The tape frame 604 may have one or more notches 608 to facilitate alignment and handling. For a semiconductor wafer 610 having a 300 mm diameter, the tape frame 604 may have a width of about 340 mm to about 420 mm and a length of about 340 mm to about 420 mm. The second type of substrate 112b may alternatively be a carrier plate configured to have the plurality of chiplets 606 coupled to the carrier plate.

Referring back to FIG. 1, the one or more process chambers 106 may be sealingly engaged with the transfer chamber 116. The transfer chamber 116 generally operates at atmospheric pressure but may be configured to operate at vacuum pressure. For example, the transfer chamber 116 may be a non-vacuum chamber configured to operate at an atmospheric pressure of about 700 Torr or greater. Additionally, while the one or more process chambers 106 are generally depicted as orthogonal to the transfer chamber 116, the one or more process chambers 106 may be disposed at an angle with respect to the transfer chamber 116 or a combination of orthogonal and at an angle. For example, the second automation module 110b depicts a pair of the one or more process chambers 106 disposed at an angle with respect to the transfer chamber 116.

The transfer chamber 116 includes a buffer 120 configured to hold one or more first type of substrates 112a. In some embodiments, the buffer 120 is configured to hold one or more of the first type of substrates 112a and one or more of the second type of substrates 112b. The transfer chamber 116 includes a transfer robot 126 configured to transfer the first type of substrates 112a and the second type of substrates 112b between the buffer 120, the one or more process chambers 106, and a buffer disposed in an adjacent automation module of the plurality of automation modules 110. For example, the transfer robot 126 in the first automation module 110a is configured to transfer the first type of substrates 112a and the second type of substrates 112b between the first automation module 110a and the buffer 120 in the second automation module 110b. In some embodiments, the buffer 120 is disposed within the interior volume of the transfer chamber 116, advantageously reducing the footprint of the overall tool. In addition, the buffer 120 can be open to the interior volume of the transfer chamber 116 for ease of access by the transfer robot 126.

Figure 7:
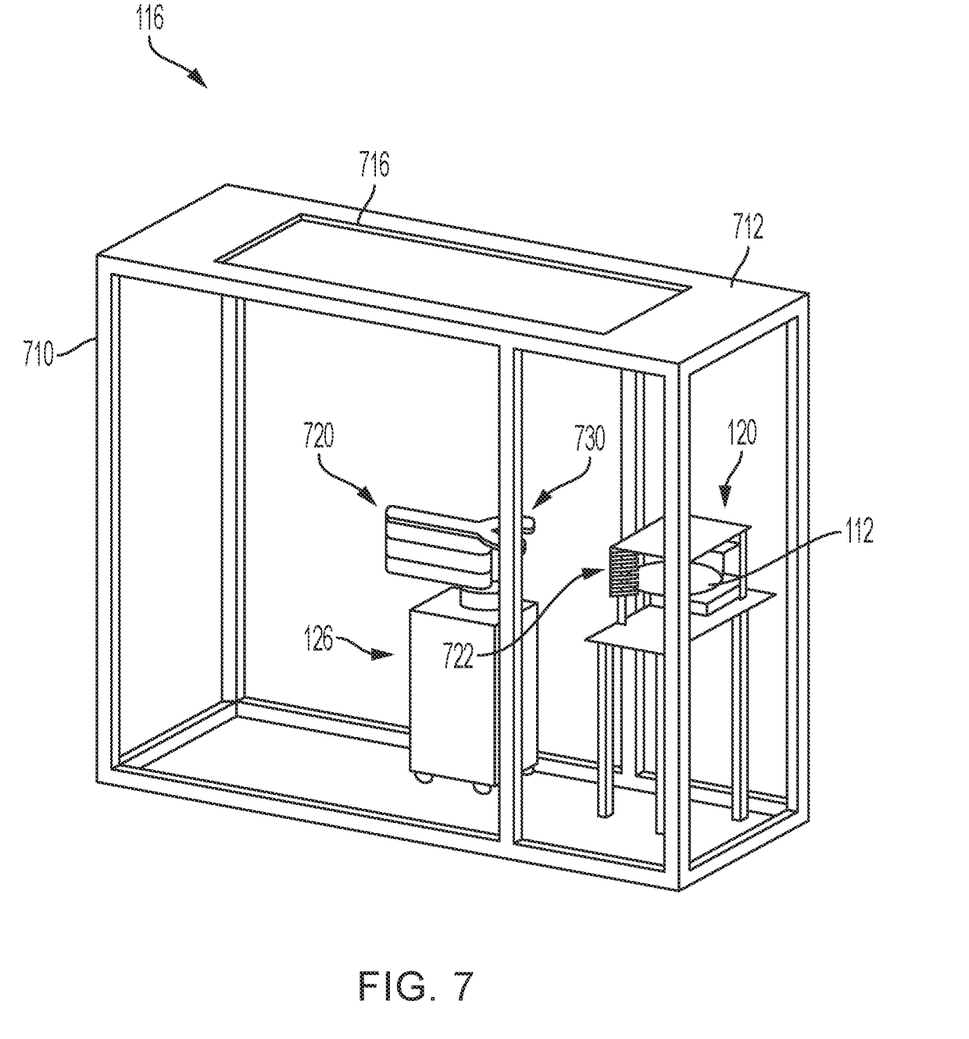
FIG. 7 depicts an isometric view of a simplified automation module in accordance with at least some embodiments of the present disclosure.

FIG. 7 depicts an isometric view of a transfer chamber 116 of the plurality of automation modules 110 in accordance with at least some embodiments of the present disclosure. The transfer chamber 116 is depicted in simplified form to describe the key components. The transfer chamber 116 generally includes a frame 710 that is covered with plates (top plate 712 shown in FIG. 7, side plates not shown) to enclose the transfer chamber 116. In some embodiments, the transfer chamber 116 has a width less than a length. The top plate 712 (or side plates) may include an access opening 716 that is selectively opened or closed for servicing the transfer chamber 116. The side plates include openings at interfaces with at least one of the one or more process chambers 106, the EFEM 102, or adjacent transfer chambers. While FIG. 7 shows the transfer chamber 116 having a rectangular or box shape, the transfer chamber 116 may have any other suitable shape, such as cylindrical, hexagonal, or the like. The one or more process chamber 106 may be coupled orthogonally to the transfer chamber 116 or may be coupled at an angle with respect to the transfer chamber 116.

The transfer chamber 116 may have one or more environmental controls. For example, an airflow opening (e.g., access opening 716) in the transfer chamber 116 may include a filter to filter the airflow entering the transfer chamber 116. Other environmental controls may include one or more of humidity control, static control, temperature control, or pressure control.

The transfer robot 126 is generally housed within the frame 710. The transfer robot 126 is configured for rotational or rotational and linear movement within the transfer chamber 116. In some embodiments, the transfer robot 126 moves linearly via rails on a floor of the transfer chamber 116 or via wheels under the transfer robot 126. The transfer robot 126 includes a telescoping arm 720 having one or more end effectors 730 that can extend into the one or more process chamber 106 and into adjacent automation modules. In some embodiments, the one or more end effectors 730 comprise substrate end effectors for handling the first type of substrates 112a and second end effectors for handling the second type of substrates 112b. In some embodiments, for a transfer chamber 116 having a length of about 2.0 to about 2.5 meters, the telescoping arm 720 may have a stroke length of up to about 1.0 meter. In some embodiments, the EFEM robot 104 is the same type and configuration as the transfer robot 126 for enhanced commonality of parts.

The buffer 120 is housed within the frame 710, for example, in an interior volume of the frame 710. In some embodiments, the buffer 120 is configured to rotate to align the first type of substrates 112a and the second type of substrates 112b in a desired manner. In some embodiments, the buffer is configured to hold the one or more types of substrates 112 in a vertical stack advantageously reducing the footprint of the transfer chamber 116. For example, in some embodiments, the buffer 120 includes a plurality of shelves 722 for storing or holding one or more first type of substrates 112a and one or more second type of substrates 112b. In some embodiments, the plurality of shelves 722 are disposed in a vertically spaced apart configuration. In some embodiments, the buffer 120 includes six shelves. In some embodiments, the plurality of shelves comprises two shelves to accommodate the second type of substrates 112b.

Referring back to FIG. 1, the one or more process chambers 106 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chamber, or the like. Examples of vacuum chambers may include plasma chambers. The types of atmospheric chambers discussed above may also be configured to operate under vacuum, if needed. The one or more process chambers 106 may be any process chambers or modules needed to perform a bonding process, a dicing process, a cleaning process, a plating process, or the like.

In some embodiments, the one or more process chambers 106 of each of the plurality of automation modules 110 include at least one of a wet clean chamber 122, a plasma chamber 130, a degas chamber 132, a radiation chamber 134, or a bonder chamber 140 such that the multi-chamber processing tool 100 includes at least one wet clean chamber 122, at least one plasma chamber 130, at least one degas chamber 132, at least one radiation chamber 134, and at least one bonder chamber 140.

The wet clean chamber 122 is configured to perform a wet clean process to clean the one or more types of substrates 112 via a fluid, such as water. The wet clean chamber 122 may include a first wet clean chamber 122a for cleaning the first type of substrates 112a or a second wet clean chamber 122b for cleaning the second type of substrates 112b.

The degas chamber 132 is configured to perform a degas process to remove moisture from the substrates 112 via for example, a high temperature baking process. In some embodiments, the degas chamber 132 includes a first degas chamber 132a for the first type of substrates 112a and a second degas chamber 132b for the second type of substrates 112b.

The plasma chamber 130 may be configured to perform an etch process to remove unwanted material, for example organic materials and oxides, from the first type of substrates 112a or the second type of substrates 112b. In some embodiments, the plasma chamber 130 includes a first plasma chamber 130a for the first type of substrates 112a and a second plasma chamber 130b for the second type of substrates 112b. The plasma chamber 130 may also be configured to perform an etch process to dice the substrates 112 into chiplets. In some embodiments, the plasma chamber 130 may be configured to perform a deposition process, for example, a physical vapor deposition process, a chemical vapor deposition process, or the like, to coat the first type of substrates 112a or the second type of substrates 112b with a desired layer of material.

The radiation chamber 134 is configured to perform a radiation process on the second type of substrates 112b to reduce adhesion between the plurality of chiplets 606 and the backing tape 602. For example, the radiation chamber 134 may be an ultraviolet radiation chamber configured to direct ultraviolet radiation at the backing tape 602 or a heating chamber configured to heat the backing tape 602. The reduced adhesion between the plurality of chiplets 606 and the backing tape 602 facilitates easier removal of the plurality of chiplets 606 from the second type of substrates 112b.

The bonder chamber 140 is configured to transfer and bond at least a portion of the plurality of chiplets 606 to one of the first type of substrates 112a. The bonder chamber 140 generally includes a first support 142 to support one of the first type of substrates 112a and a second support 144 to support one of the second type of substrates 112b.

In some embodiments, the one or more process chambers 106 of the first automation module 110a includes at least one of a plasma chamber 130 or a degas chamber 132 and includes a wet clean chamber 122. In the illustrative example of FIG. 1, the first automation module 110a includes a first plasma chamber 130a and a second plasma chamber 130b on a first side of the first automation module 110a. In some embodiments, the first automation module 110a includes a first wet clean chamber 122a and a second wet clean chamber 122b on a second side of the first automation module 110a opposite the first side. In some embodiments, the second automation module includes a radiation chamber 134 and at least one of a plasma chamber 130 or a degas chamber 132.

In some embodiments, a last automation module of the plurality of automation module 110, for example the third automation module 110c of FIG. 1, includes one or more bonder chambers 140 (two shown in FIG. 1). In some embodiments, a first of the two bonder chambers is configured to remove and bond chiplets having a first size and a second of the two bonder chambers is configured to remove and bond chiplets having a second size. In some embodiments, any of the plurality of automation modules 110 include a metrology chamber 118 configured to take measurements of the one or more types of substrates 112. In FIG. 1, the metrology chamber 118 is shown as a part of the second automation module 110b coupled to the transfer chamber 116 of the second automation module 110b. However, the metrology chamber 118 may be coupled to any transfer chamber 116 or within the transfer chamber 116.

A controller 180 controls the operation of any of the multi-chamber processing tools described herein, including the multi-chamber processing tool 100. The controller 180 may use a direct control of the multi-chamber processing tool 100, or alternatively, by controlling the computers (or controllers) associated with the multi-chamber processing tool 100. In operation, the controller 180 enables data collection and feedback from the multi-chamber processing tool 100 to optimize performance of the multi-chamber processing tool 100. The controller 180 generally includes a Central Processing Unit (CPU) 182, a memory 184, and a support circuit 186. The CPU 182 may be any form of a general-purpose computer processor that can be used in an industrial setting. The support circuit 186 is conventionally coupled to the CPU 182 and may comprise a cache, clock circuits, input/output subsystems, power supplies, and the like. Software routines, such as a method as described below may be stored in the memory 184 and, when executed by the CPU 182, transform the CPU 182 into a specific purpose computer (controller 180). The software routines may also be stored and/or executed by a second controller (not shown) that is located remotely from the multi-chamber processing tool 100.

The memory 184 is in the form of computer-readable storage media that contains instructions, when executed by the CPU 182, to facilitate the operation of the semiconductor processes and equipment. The instructions in the memory 184 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
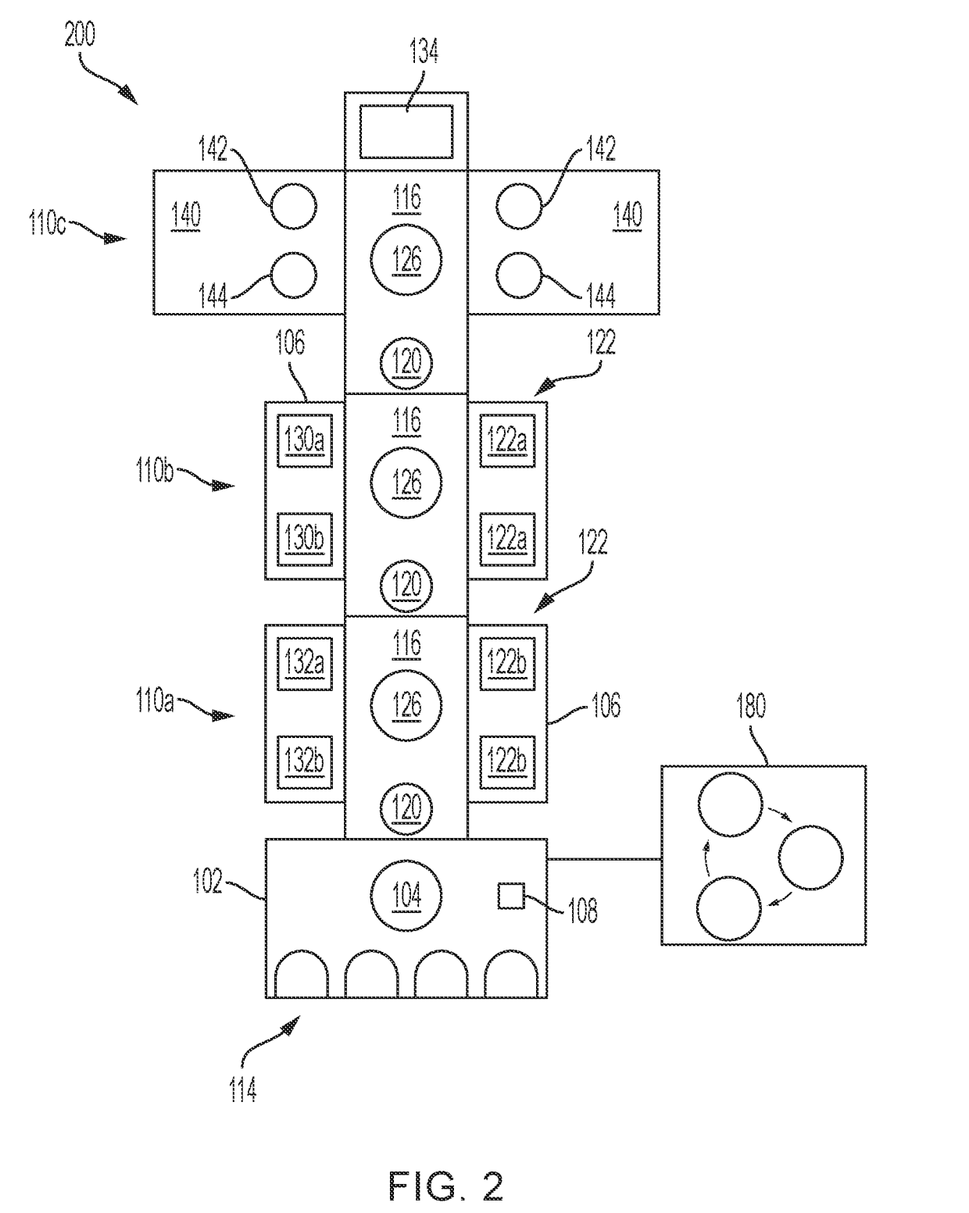
FIG. 2 depicts a schematic top view of a multi-chamber processing tool for bonding chiplets to a substrate in accordance with at least some embodiments of the present disclosure.

FIG. 2 depicts a schematic top view of a multi-chamber processing tool 200 for bonding chiplets to a substrate in accordance with at least some embodiments of the present disclosure. The multi-chamber processing tool 200 is similar to the multi-chamber processing tool 100, with a different configuration of the one or more process chambers 106. The multi-chamber processing tool 200 includes three automation modules. In some embodiments, the first automation module 110a includes a first degas chamber 132a configured to degas the first type of substrate 112a and a second degas chamber 132b configured to degas the second type of substrate 112b on the first side of the first automation module 110a and two second wet clean chambers 122b on a second side of the first automation module 110a opposite the first side. In some embodiments, the second side of the first automation module 110a may alternatively include two first wet clean chambers 122a or one first wet clean chamber 122a and one second wet clean chamber 122b.

In some embodiments, the second automation module 110b includes a first plasma chamber 130a and a second plasma chamber 130b on a first side of the second automation module 110b. In some embodiments, a second side of the second automation module 110b opposite the first side includes two first wet clean chambers 122a. In some embodiments, the second side of the second automation module 110b includes a first wet clean chamber 122a and a radiation chamber 134. In some embodiments, the one or more process chambers 106 of the last automation module, for example, the third automation module 110c of FIG. 2, includes two bonder chambers 140 and a radiation chamber 134. In some embodiments, the radiation chamber 134 is disposed along a width of the transfer chamber 116. The placement of the radiation chamber 134 in the third automation module 110c advantageously provides the multi-chamber processing tool 200 with an additional two wet clean chambers 122 as compared to the multi-chamber processing tool 100.

Figure 3:
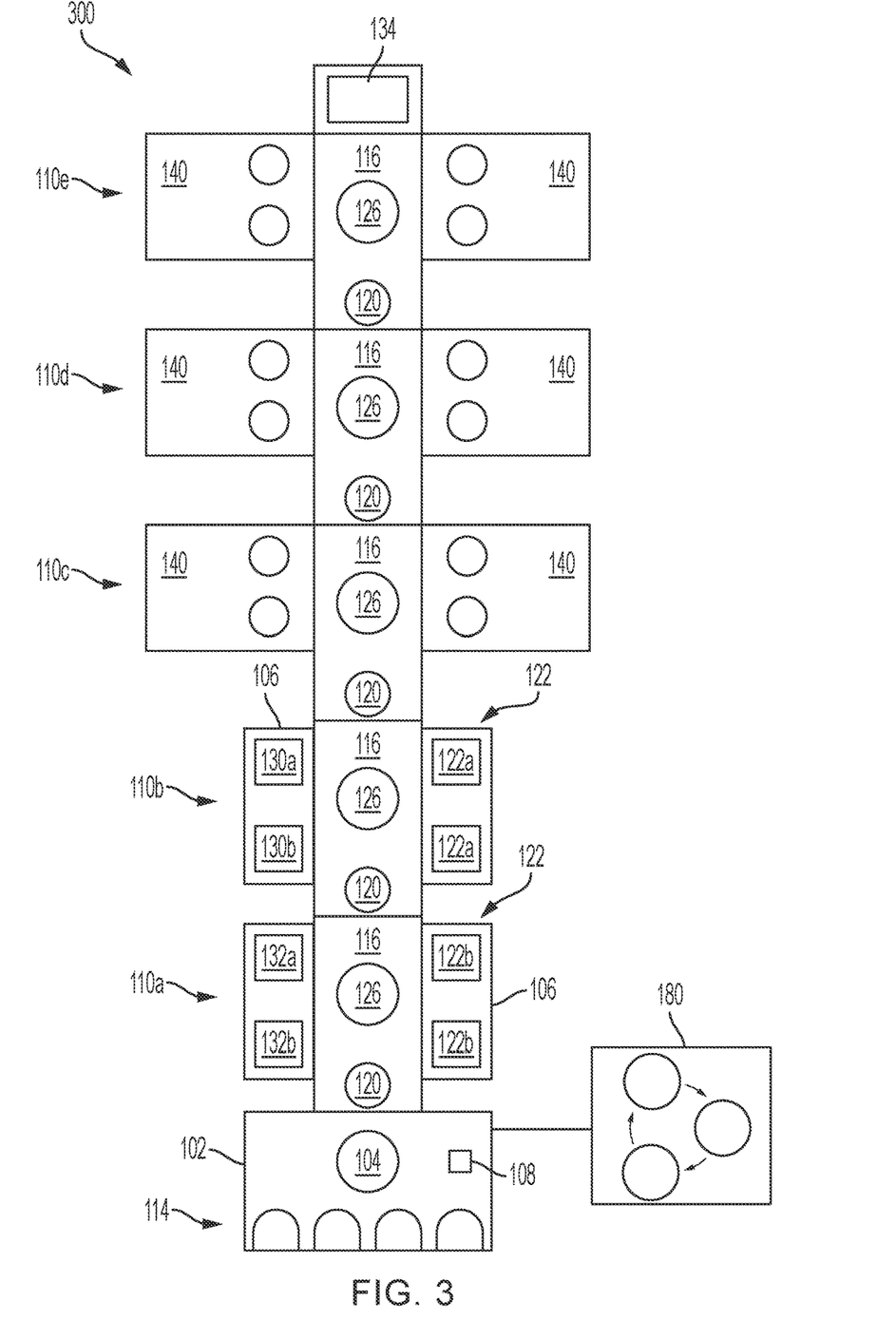
FIG. 3 depicts a schematic top view of a multi-chamber processing tool for bonding chiplets to a substrate in accordance with at least some embodiments of the present disclosure.

FIG. 3 depicts a schematic top view of a multi-chamber processing tool 300 for bonding chiplets to a substrate in accordance with at least some embodiments of the present disclosure. The multi-chamber processing tool 300 is similar to the multi-chamber processing tool 200 except that the multi-chamber processing tool 300 includes a fourth automation module 110d and a fifth automation module 110e. In some embodiments, the plurality of automation modules 110 include one or more automation modules having one or more bonder chambers 140 disposed between the first automation module 110a and a last automation module, for example the fifth automation module 110e of FIG. 3.

In some embodiments, the multi-chamber processing tool 300 includes six bonder chambers 140, where the six bonder chambers 140 are configured to process a same type and size of chiplets or different types and sizes of chiplets. In some embodiments, the fifth automation module 110e includes a radiation chamber 134. The modular configuration of the multi-chamber processing tool 300 advantageously facilitates concurrent bonding or additional substrates and additional types and sizes of chiplets as compared to the multi-chamber processing tool 200 of FIG. 2.

Figure 4:
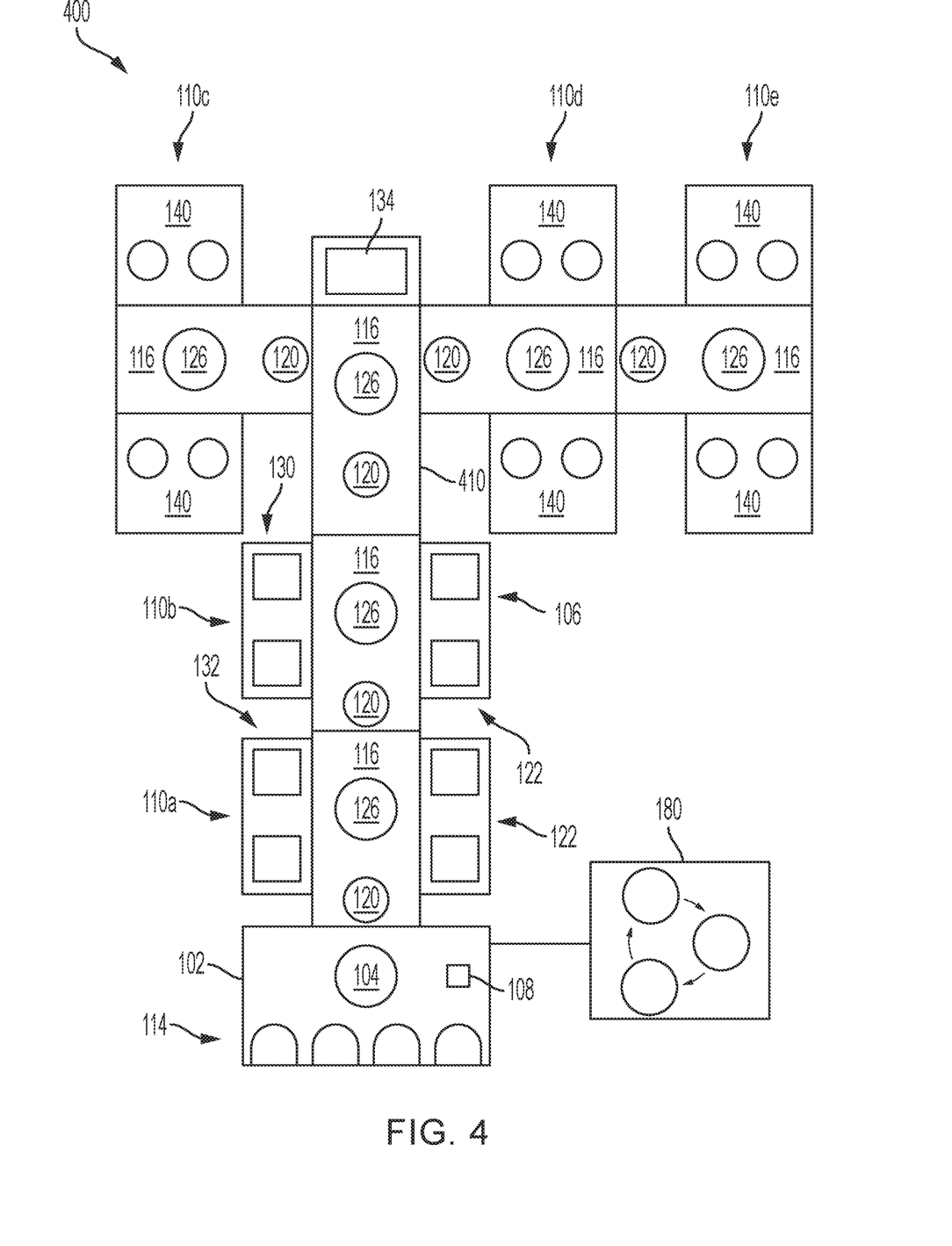
FIG. 4 depicts a schematic top view of a multi-chamber processing tool for bonding chiplets to a substrate arranged in an T-shaped configuration in accordance with at least some embodiments of the present disclosure.

FIG. 4 depicts a schematic top view of a multi-chamber processing tool 400 for bonding chiplets to a substrate arranged in a T-shaped configuration in accordance with at least some embodiments of the present disclosure. The T-shaped configuration of the multi-chamber processing tool 400 advantageously reduces a length of the tool as compared to a linear layout such as with the multi-chamber processing tool 300, while having a same or similar number of process chambers as multi-chamber processing tool 300.

In some embodiments, as shown in FIG. 4, the plurality of automation modules 110 include a junction module 410 that is coupled to automation modules on three sides of the junction module 410. In some embodiments, the plurality of automation modules 110 comprise a first automation module 110a coupled to the EFEM 102, a second automation module 110b coupled to the first automation module 110a at one end and a junction module 410 at an opposite end. In some embodiments, a third automation module 110c and a fourth automation module 110d are coupled to the junction module 410 at opposite sides of the junction module 410. In some embodiments, a fifth automation module 110e is coupled to the fourth automation module 110d at an end opposite the junction module 410. In some embodiments, the transfer robot 126 in the junction module 410 is configured to transfer the one or more types of substrates 112 between the buffer 120 in the junction module 410 and the buffers in the third automation module 110c and the fourth automation module 110d. In some embodiments, the junction module 410 includes a radiation chamber 134 on a side of the junction module 410 opposite the second automation module 110b.

Figure 5:
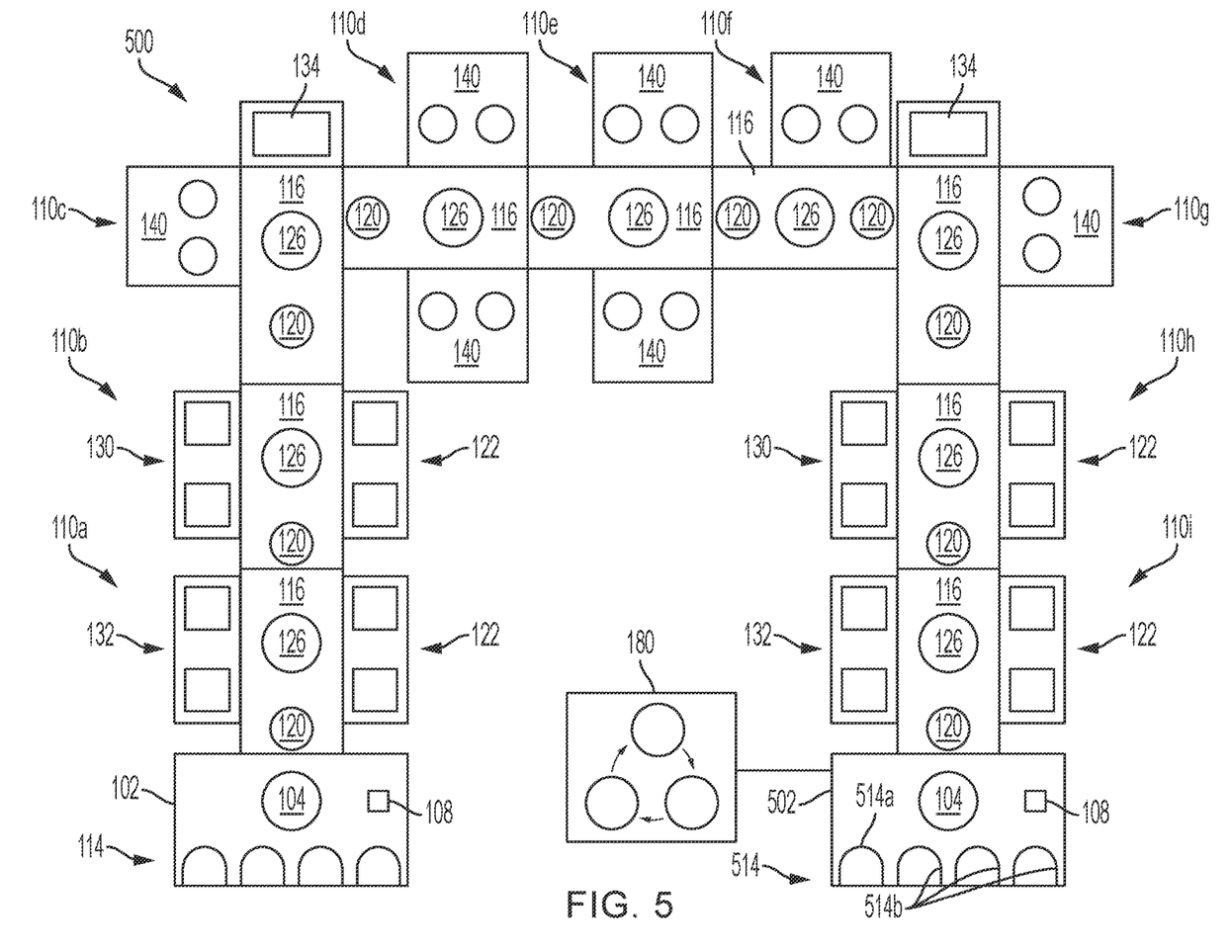
FIG. 5 depicts a schematic top view of a multi-chamber processing tool for bonding chiplets to a substrate arranged in a U-shaped configuration in accordance with at least some embodiments of the present disclosure.

FIG. 5 depicts a schematic top view of a multi-chamber processing tool 500 for bonding chiplets to a substrate arranged in a U-shaped configuration in accordance with at least some embodiments of the present disclosure. The multi-chamber processing tool 500 includes the plurality of automation modules 110 arranged in a U-shaped configuration. As shown in FIG. 5, a first set of three automation modules 110a-110c are arranged linearly, a second set of three automation modules 110d-110f extend perpendicularly from the first set, and a third set of three automation modules 110g-110i extend perpendicularly form the second set and parallel to the first set. The U-shaped configuration of the multi-chamber processing tool 500 advantageously reduces a length of the tool as compared to linear configurations such as with the multi-chamber processing tool 300 of FIG. 3.

In some embodiments, a second EFEM 502 is coupled to a last automation module of the plurality of automation modules 110. For example, in FIG. 5, the last automation module, or ninth automation module 110i is coupled to the second EFEM 502. In some embodiments, the second EFEM 502 includes one or more loadports 514 and an EFEM robot 104. In some embodiments, the one or more loadports 514 include one or more first loadports 514a for receiving the first type of substrate 112a and one or more second loadports 514b for receiving a second type of substrate 112b having a plurality of chiplets. In some embodiments, the one or more loadports 514 include four second loadports 514b and no first loadports 514a. The addition of the second EFEM 502 advantageously adds additional loadports and an additional scanning station 108 to the tool, increasing processing throughput. In some embodiments, each of the EFEM 102 and the second EFEM 502 have two or more loadports each. In some embodiments, the EFEM 102 and the second EFEM 502 together comprise two or more of the first loadports 114a and four or more of the second loadports 116b. In some embodiments, the EFEM 102 and the second EFEM 502 together comprise two of the first loadports 114a and six of the second loadports 116b. The second EFEM 502 may be added to any of the multi-chamber processing tools described herein.

In some embodiments, with a U-shaped configuration, one of the automation modules of the plurality of automation modules 110 may include two buffers 120. FIG. 5 depicts the sixth automation module 110f having the two buffers 120, however any of the second set of three automation modules 110d-110f may include the two buffers 120. In some embodiments, the third automation module 110c and the seventh automation module 110g may include a radiation chamber 134. The configurations of the one or more process chambers 106 associated with the plurality of automation modules 110 in any of FIG. 1 through FIG. 5 are exemplary and the one or more process chambers 106 may be rearranged in any suitable manner for a desired application in any of the multi-chamber processing tools 100, 200, 300, 400, 500.

Figure 8:
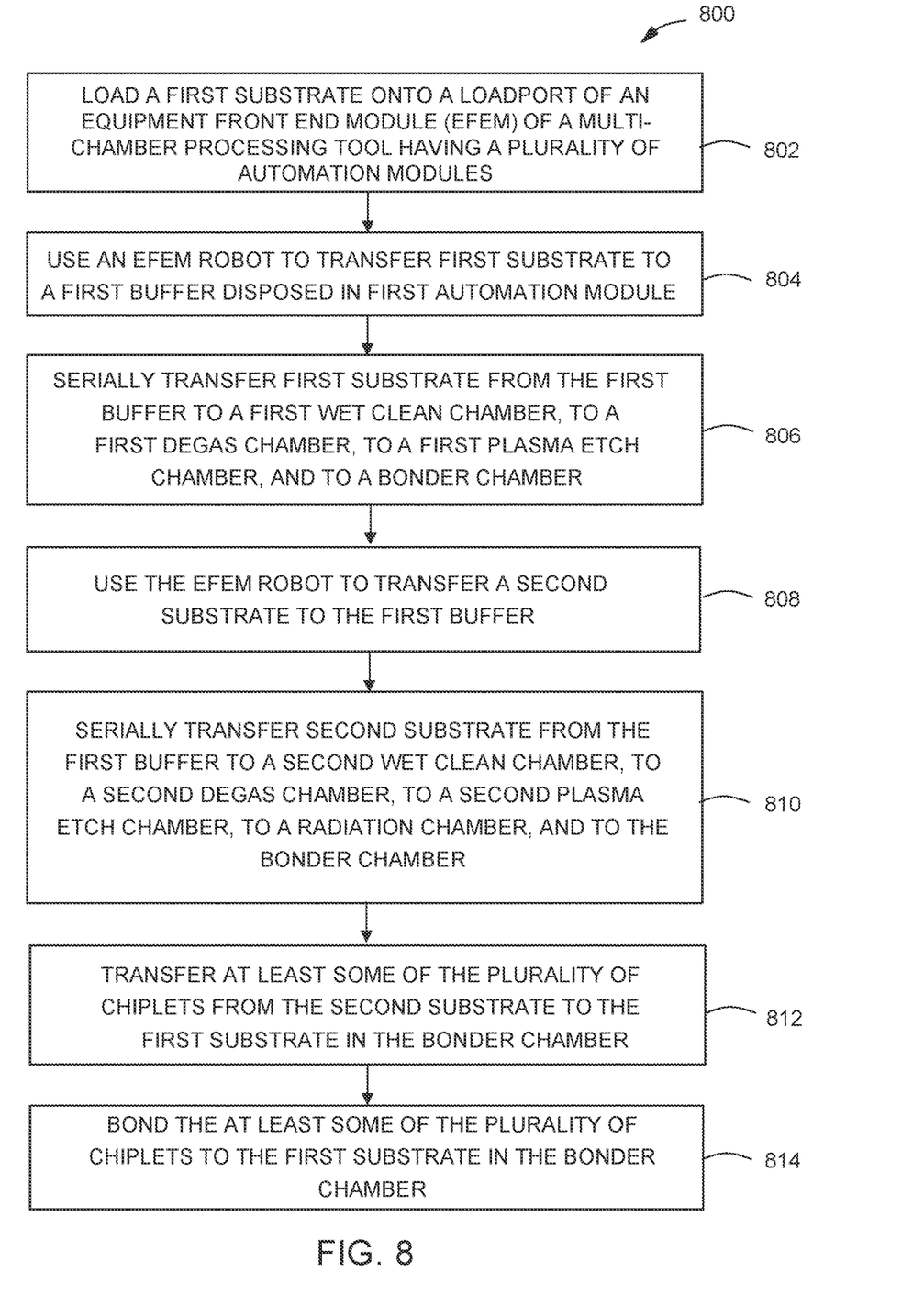
FIG. 8 depicts a flow chart of a method of bonding chiplets to a substrate in accordance with at least some embodiments of the present disclosure.

FIG. 8 depicts a flow chart of a method 800 of bonding chiplets to a substrate in accordance with at least some embodiments of the present disclosure. At 802, the method 800 includes loading a substrate (e.g., first type of substrates 112*a*) onto a loadport (e.g., substrate loadport 114*a*) of an equipment front end module (EFEM) (e.g., equipment front end module 102) of a multi-chamber processing tool (e.g., multi-chamber processing tool 100, 200, 300, 400, 500) having a plurality of automation modules (e.g., plurality of automation modules 110).

At 804, the method 800 includes using an EFEM robot (e.g., EFEM robot 104) to transfer the first type of substrate to a first buffer (e.g., buffer 120) disposed in a first automation module (e.g., first automation module 110*a*) coupled to the EFEM. In some embodiments, an EFEM robot is used to transfer the first type of substrate to a scanning station (e.g., scanning station 108) in the EFEM, prior to transferring to the first buffer, to record identifying information to determine process steps based on the identifying information. For example, the identifying information may dictate at least one of how many different types of chiplets are to be bonded to the first type substrate, how many layers of chiplets are to be bonded to the first type of substrate, or the desired arrangement of the chiplets when bonded to the first type of substrate. The identifying information may also dictate which pre-bonding process steps are necessary (e.g., wet clean, plasma etch, degas, ultraviolet process, or the like) and process parameters (e.g., duration, power, temperature, or the like). The identifying information may be read via a substrate ID reader, such as an OCR reader or a bar code reader.

At 806, the method 800 includes serially transferring, via respective transfer robots (e.g., transfer robot 126) in each of the plurality of automation modules, the first type of substrate from the first buffer to a first wet clean chamber (e.g., first wet clean chamber 122*a*) to perform a cleaning process, to a first degas chamber (e.g., first degas chamber 132*a*) to perform a degas process to dry the first type of substrate, to a first plasma chamber (e.g., first plasma chamber 130*a*) to perform a plasma etch process to remove unwanted material from the first type of substrate, and to a bonder chamber (e.g., bonder chamber 140).

At 808, the method 800 includes using the EFEM robot to transfer a second type of substrate (e.g., second type of substrates 112*b*), having a plurality of chiplets, to the first buffer from a second loadport (e.g., one or more second loadports 114*b*). In some embodiments, an EFEM robot is used to transfer the second type of substrate to the scanning station in the EFEM, prior to transferring to the first buffer, to record identifying information to determine process steps based on the identifying information. The identifying information may be read via an OCR reader or a bar code reader.

At 810, the method 800 includes serially transferring, via respective transfer robots in each of the plurality of automation modules the second type of substrate from the first buffer to a second wet clean chamber (e.g., second wet clean chamber 122*b*) to perform a cleaning process, to a second degas chamber (e.g., second degas chamber 132*b*) to perform a degas process to dry the second type of substrate, to a second plasma chamber (e.g., second plasma chamber 130*b*) to perform a plasma etch process to remove unwanted material from the second type of substrate, to a radiation chamber (e.g., radiation chamber 134) to perform a radiation process to weaken adhesive bonds between the chiplets and the second type of substrate, and to the bonder chamber. In some embodiments, the radiation process is a UV radiation process. In some embodiments, the radiation process is a heating process.

At 812, the method 800 includes transferring at least some of the plurality of chiplets from the second type of substrate to the first type of substrate in the bonder chamber. At 814, the method 800 includes bonding the at least some of the plurality of chiplets to the first type of substrate in the bonder chamber via a suitable bonding method. In some embodiments, the first type of substrate is transferred to a second bonder chamber after bonding the at least some of the plurality of chiplets to the first type of substrate in the bonder chamber. In some embodiments, a second one of the second type of substrate is transferred to the second bonder chamber. In some embodiments, the second one of the second type of substrate includes a plurality of second chiplets having a size different than the plurality of chiplets. In some embodiments, at least some of the plurality of second chiplets are transferred and bonded onto the first type of substrate in the second bonder chamber.

In some embodiments, the first type of substrate may be transferred to a third bonder chamber to bond a third plurality of chiplets to the first type of substrate having a different size than the plurality of chiplets and the second plurality of chiplets. Accordingly, the multi-chamber processing tool is configured to accommodate N bonder chambers as needed to bond N different type or size of chiplets onto a given substrate. For example, the multi-chamber process tool 400 of FIG. 4 includes six bonder chambers to accommodate six different types or sizes of chiplets. Once bonding is complete, the first type of substrate is shuttled back to a first loadport via the buffers and via the transfer robots of the multi-chamber processing tool. Once bonding is complete, the second type of substrate may remain in the multi-chamber processing tool for subsequent processing or subsequent first type of substrate, or alternatively, may be shuttled back to a second loadport via the buffers and via the transfer robots.

In some embodiments, the plurality of chiplets are arranged along a first layer of chiplets on the first type of substrate. In some embodiments, the first type of substrate with the first layer of chiplets is transferred to a first plasma chamber of the multi-chamber processing tool to perform a supplemental plasma etch process to remove unwanted material. In some embodiments, the first type of substrate is subsequently transferred to the bonding chamber or a second bonding chamber. In the bonding chamber or the second bonding chamber, the plurality of chiplets from the second type of substrate or a plurality of second chiplets from a one of the second type of substrate are transferred onto the first layer along a second layer of chiplets. The second layer of chiplets may comprise the same type and size of chiplets as the first layer of chiplets. Alternatively, the second layer of chiplets may comprise at least one of a different type or size of chiplets than the first layer of chiplets.

In some embodiments, the first type of substrate and the second type of substrate are processed concurrently in the multi-chamber processing tool. In some embodiments, multiple first type of substrates and multiple second type of substrates are processed in the multi-chamber processing tool concurrently to advantageously increase processing throughput. The multi-chamber process tool may include a second EFEM (e.g., second EFEM 502) or a third EFEM to provide additional loadports and scanning stations to advantageously increase processing capabilities. For example, at least one of a first one of the first type of substrate or a first one of the second type of substrate may undergo a wet clean process, while a second one of the first type of substrate is undergoing a degas process, and a third one of the first type of substrate and a second one of the second type of substrate are undergoing a bonding process. In another example, a first one of the first type of substrate and a second one of the first type of substrate may undergo a wet clean process, while a third one of the first type of substrate is undergoing a degas process and a fourth one of the first type of substrate and a fifth one of the first type of substrate are undergoing a bonding process with a first one of the second type of substrate and a second one of the second type of substrate, respectively. These are non-limiting examples of how multiple first type of substrates and second type of substrates may be processed in the multi-chamber processing tool.

In some embodiments, the multi-chamber processing tool may be configured to perform a plasma dicing or singulation process using a plasma chamber of the multi-chamber processing tool prior to bonding chiplets to the first type of substrate. In some embodiments, the multi-chamber processing tool may be configured to perform additional cleaning or substrate plating processes before or after bonding chiplets to the first type of substrate. The plurality of automation modules generally can interface with the EFEM to hand off substrates to one or more process chambers associated with each of the automation modules. Accordingly, a suitable number of automation modules and associated process chambers may be used to accommodate a desired throughput of processed substrates.

While the foregoing is directed to embodiments of the present disclosure, other and further embodiments of the disclosure may be devised without departing from the basic scope thereof.

The invention claimed is:

1. A multi-chamber processing tool for processing substrates, comprising:
   an equipment front end module (EFEM) having one or more loadports for receiving one or more types of substrates; and
   a plurality of automation modules coupled to each other and having a first automation module coupled to the EFEM, wherein each of the plurality of automation modules include a transfer chamber and one or more process chambers coupled to the transfer chamber, wherein the transfer chamber includes a buffer configured to hold a plurality of the one or more types of substrates, and wherein the transfer chamber includes a transfer robot configured to transfer the one or more types of substrates between the buffer, the one or more process chambers, and a buffer disposed in an adjacent automation module of the plurality of automation modules, wherein at least one of:
   the one or more loadports include one or more first loadports for receiving a first type of substrate and one or more second loadports for receiving a second type of substrate having a plurality of chiplets, and wherein the one or more process chambers of each of the plurality of automation modules include at least one of a wet clean chamber, a plasma chamber, a degas chamber, a radiation chamber, or a bonder chamber such that the multi-chamber processing tool includes at least one wet clean chamber, at least one plasma chamber, at least one degas chamber, at least one radiation chamber, and at least one bonder chamber; or
   the plurality of automation modules comprise a first automation module coupled to the EFEM, a second automation module coupled to the first automation module at one end and a junction module at an opposite end, a third automation module and a fourth automation module coupled to the junction module at opposite sides of the junction module, and a fifth automation module coupled to the fourth automation module at an end opposite the junction module, wherein the junction module includes a buffer and a transfer robot; or
   the plurality of automation modules comprise a first automation module coupled to the EFEM, a second automation module coupled to the first automation module at one end and a junction module at an opposite end, a third automation module and a fourth automation module coupled to the junction module at opposite sides of the junction module, and a fifth automation module coupled to the fourth automation module at an end opposite the junction module, wherein the junction module includes a buffer and a transfer robot.

2. The multi-chamber processing tool of claim 1, wherein the one or more loadports include the one or more first loadports for receiving the first type of substrate and the one or more second loadports for receiving the second type of substrate having a plurality of chiplets, and wherein the one or more process chambers of each of the plurality of automation modules include at least one of the wet clean chamber, the plasma chamber, the degas chamber, the radiation chamber, or the bonder chamber such that the multi-chamber processing tool includes at least one wet clean chamber, at least one plasma chamber, at least one degas chamber, at least one radiation chamber, and at least one bonder chamber.

3. The multi-chamber processing tool of claim 2, wherein the one or more process chambers of a first automation module includes at least one of a plasma chamber or a degas chamber and includes a wet clean chamber, and a last automation module of the plurality of automation modules include one or more bonder chambers configured to remove the plurality of chiplets from the second type of substrate and bond the plurality of chiplets onto the first type of substrate.

4. The multi-chamber processing tool of claim 2, wherein the at least one wet clean chamber includes a first wet clean chamber for cleaning the first type of substrate and a second wet clean chamber for cleaning the second type of substrate, wherein the at least one plasma chamber includes a first plasma chamber for processing the first type of substrate and a second plasma chamber for processing the second type of substrate, and wherein the at least one degas chamber includes a first degas chamber for processing the first type of substrate and a second degas chamber for processing the second type of substrate.

5. The multi-chamber processing tool of claim 1, wherein the transfer chamber is a non-vacuum chamber.

6. The multi-chamber processing tool of claim 1, wherein the plurality of automation modules include one or more automation modules having one or more bonder chambers disposed between the first automation module and a last automation module.

7. The multi-chamber processing tool of claim 1, wherein the plurality of automation modules comprise the first automation module coupled to the EFEM, the second automation module coupled to the first automation module at one end and the junction module at the opposite end, the third automation module and the fourth automation module coupled to the junction module at opposite sides of the junction module, and the fifth automation module coupled to the fourth automation module at the end opposite the junction module, wherein the junction module includes the buffer and the transfer robot.

8. The multi-chamber processing tool of claim 1, further comprising a second EFEM coupled to a last automation module of the plurality of automation modules, wherein the second EFEM includes a plurality of loadports and an EFEM robot; and wherein the plurality of automation modules are arranged in a U-shaped configuration.

9. The multi-chamber processing tool of claim 1, wherein the EFEM includes a scanning station having a substrate ID reader.

10. A multi-chamber processing tool for processing a substrate, comprising:
an equipment front end module (EFEM) having one or more first loadports for receiving a first type of substrate, one or more second loadports for receiving a second type of substrate having a plurality of chiplets, and a EFEM robot configured to transfer the first type of substrate and the second type of substrate; and
a plurality of automation modules coupled to each other and having a first automation module coupled to the EFEM, wherein each of the plurality of automation modules include a transfer chamber and a one or more process chambers comprising at least one of a wet clean chamber, a plasma chamber, a degas chamber, a radiation chamber, or a bonder chamber, coupled to the transfer chamber, wherein the transfer chamber includes a buffer configured to hold one or more of the first type of substrates and one or more of the second type of substrates, and wherein the transfer chamber includes a transfer robot configured to transfer the first type of substrate and the second type of substrate between the buffer, the one or more process chambers, and a buffer disposed in an adjacent automation module of the plurality of automation modules; and
wherein the one or more process chambers of a first automation module of the plurality of automation modules includes at least one of a plasma chamber or a degas chamber and includes a wet clean chamber, a second automation module of the plurality of automation modules coupled to the first automation module includes at least one of a plasma chamber or a degas chamber, and a third automation module of the plurality of automation modules coupled to the second automation module includes one or more bonder chambers configured to remove the plurality of chiplets from the second type of substrate and bond the plurality of chiplets onto the first type of substrate.

11. The multi-chamber processing tool of claim 10, wherein the third automation module includes two bonder chambers, wherein a first of the two bonder chambers is configured to remove and bond chiplets having a first size and a second of the two bonder chambers is configured to remove and bond chiplets having a second size.

12. The multi-chamber processing tool of claim 10, wherein the buffer is configured to rotate to align the second type of substrate.

13. The multi-chamber processing tool of claim 10, wherein the EFEM robot and the transfer robot include first end effectors for handling the first type of substrate and second end effectors for handling the second type of substrate.

14. The multi-chamber processing tool of claim 10, wherein transfer robot is configured for rotational and linear movement within the transfer chamber.

15. The multi-chamber processing tool of claim 1, further comprising:
a metrology chamber configured to take measurements of the one or more types of substrates.

16. The multi-chamber processing tool of claim 1, further comprising:
a metrology chamber coupled to one of the plurality of automation modules.

17. The multi-chamber processing tool of claim 1, wherein the one or more process chambers includes at least one wet clean chamber, at least one plasma chamber, at least one degas chamber, at least one radiation chamber, at least one bonder chamber, and at least one metrology chamber.

18. The multi-chamber processing tool of claim 1, wherein the one or more loadports include the first loadport for receiving the first type of substrate and the second loadport for receiving the second type of substrate having the plurality of chiplets, and wherein the one or more process chambers includes at least one wet clean chamber, at least one plasma chamber, at least one degas chamber, at least one radiation chamber, at least one bonder chamber, and at least one metrology chamber.

19. The multi-chamber processing tool of claim 10, further comprising:
a metrology chamber configured to take measurements of the one or more types of substrates.

20. The multi-chamber processing tool of claim 10, further comprising:
a metrology chamber coupled to one of the plurality of automation modules.

* * * * *

UNITED STATES PATENT AND TRADEMARK OFFICE
CERTIFICATE OF CORRECTION

PATENT NO. : 11,935,770 B2
APPLICATION NO. : 17/177882
DATED : March 19, 2024
INVENTOR(S) : Randy A. Harris et al.

Page 1 of 1

It is certified that error appears in the above-identified patent and that said Letters Patent is hereby corrected as shown below:

In the Claims

Column 14, Lines 6-16, in Claim 1, delete "; or
the plurality of automation modules comprise a first automation module coupled to the EFEM, a second automation module coupled to the first automation module at one end and a junction module at an opposite end, a third automation module and a fourth automation module coupled to the junction module at opposite sides of the junction module, and a fifth automation module coupled to the fourth automation module at an end opposite the junction module, wherein the junction module includes a buffer and a transfer robot"

Signed and Sealed this
Twenty-ninth Day of July, 2025

Coke Morgan Stewart
*Acting Director of the United States Patent and Trademark Office*